(12) United States Patent
New

(10) Patent No.: US 6,917,219 B2
(45) Date of Patent: Jul. 12, 2005

(54) MULTI-CHIP PROGRAMMABLE LOGIC DEVICE HAVING CONFIGURABLE LOGIC CIRCUITRY AND CONFIGURATION DATA STORAGE ON DIFFERENT DICE

(75) Inventor: Bernard J. New, Carmel Valley, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/387,622

(22) Filed: Mar. 12, 2003

(65) Prior Publication Data

US 2004/0178819 A1 Sep. 16, 2004

(51) Int. Cl.[7] .............................................. H01L 25/00
(52) U.S. Cl. ........................................ 326/41; 326/37
(58) Field of Search .................................... 326/37–41

(56) References Cited

U.S. PATENT DOCUMENTS

| | | |
|---|---|---|
| 5,162,260 A | 11/1992 | Leibovitz et al. |
| 5,270,261 A | 12/1993 | Bertin et al. |
| 5,323,060 A | 6/1994 | Fogal et al. |
| 5,327,327 A | 7/1994 | Frew et al. |
| 5,380,681 A | 1/1995 | Hsu |
| 5,481,133 A | 1/1996 | Hsu |
| 5,502,333 A | 3/1996 | Bertin et al. |
| 5,521,122 A | 5/1996 | Kuramochi |
| 5,552,633 A | 9/1996 | Sharma |
| 5,561,622 A | 10/1996 | Bertin et al. |
| 5,568,574 A | 10/1996 | Tanguay, Jr. et al. |
| 5,629,563 A | 5/1997 | Takiar et al. |
| 5,633,530 A | 5/1997 | Hsu |
| 5,640,107 A | 6/1997 | Kruse |
| 5,652,811 A | 7/1997 | Cook et al. |
| 5,705,938 A * | 1/1998 | Kean ........................... 326/39 |
| 5,781,031 A | 7/1998 | Bertin et al. |
| 5,804,004 A | 9/1998 | Tuckerman et al. |
| 5,905,639 A | 5/1999 | Warren |
| 5,990,501 A | 11/1999 | Hiyoshi et al. |
| 6,091,263 A * | 7/2000 | New et al. ..................... 326/40 |

(Continued)

FOREIGN PATENT DOCUMENTS

EP       0 740 343 A2     10/1996

OTHER PUBLICATIONS

Alex Romanelli, "Intel Stacks Flash Deck in its Favor," Electronic News, Apr. 10, 2003, available from Reed Electronics Group@ http://www.e–insite.net/electronicnews/index.asp?layout=article&articleid=CA291318.

Xilinx, Inc., "The Programmable Logic Data Book," Mar. 1999, available from Xilinx, Inc., 2100 Logic Drive, San Jose, California 95124, pp. 3–1 through 3–60.

*Primary Examiner*—Michael Tokar
*Assistant Examiner*—Linh V. Nguyen
(74) *Attorney, Agent, or Firm*—T. Lester Wallace; LeRoy D. Maunu; Justin Liu

(57) ABSTRACT

The circuitry of a programmable logic device (for example, an FPGA) includes a configurable logic portion and a configuration memory. The configuration memory stores configuration data that configures the configurable logic portion to realize a user-defined circuit. The configurable logic portion is disposed on a first die whereas the configuration memory is disposed on a second die. The second die is bonded to the first die in stacked relation. Each bit of configuration data passes from the second die to the first die through a pair of micropads. One micropad of the pair is disposed on the first die and the other micropad of the pair is disposed on the second die. When the first die and second die are brought together in face-to-face relation, the two micropads form an electrical connection through which the configuration data bit passes from the second die to the first die.

39 Claims, 5 Drawing Sheets

U.S. PATENT DOCUMENTS

| | | | |
|---|---|---|---|
| 6,107,821 A * | 8/2000 | Kelem et al. ............... 326/38 |
| 6,114,221 A | 9/2000 | Tonti et al. |
| 6,255,736 B1 | 7/2001 | Kaneko |
| 6,255,848 B1 * | 7/2001 | Schultz et al. ............. 326/41 |
| 6,271,059 B1 | 8/2001 | Bertin et al. |
| 6,337,579 B1 | 1/2002 | Mochida |
| 6,368,930 B1 | 4/2002 | Enquist |
| 6,404,226 B1 | 6/2002 | Schadt |
| 6,410,431 B2 | 6/2002 | Bertin et al. |
| 6,444,560 B1 | 9/2002 | Pogge et al. |
| 6,526,559 B2 * | 2/2003 | Schiefele et al. ............. 716/16 |
| 6,781,226 B2 * | 8/2004 | Huppenthal et al. ........ 257/686 |
| 2002/0008309 A1 | 1/2002 | Akiyama |
| 2002/0064906 A1 | 5/2002 | Enquist |

* cited by examiner

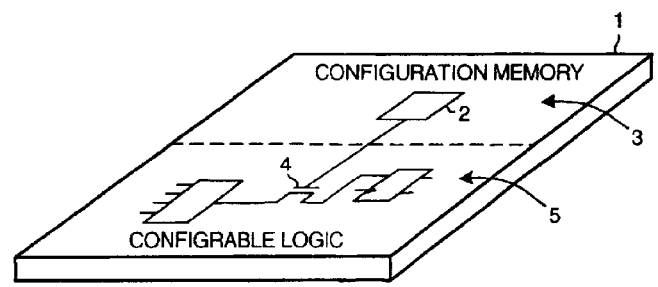
FIG. 1
(PRIOR ART)
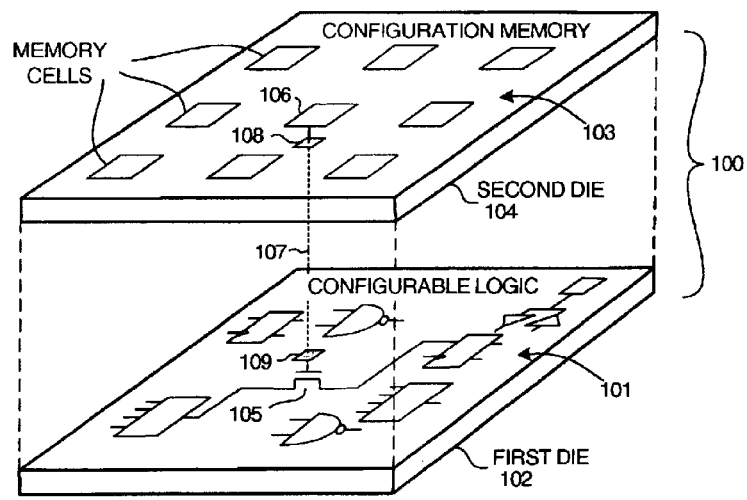
FIG. 2
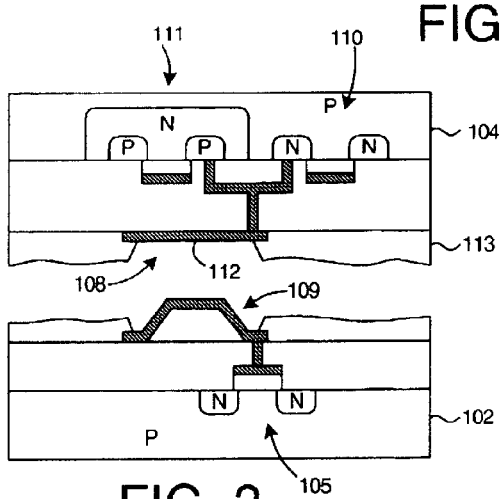
FIG. 3
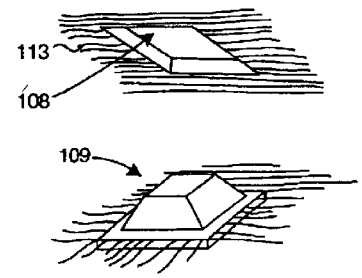
FIG. 4
FIG. 5

MULTI-CHIP PROGRAMMABLE LOGIC DEVICE HAVING CONFIGURABLE LOGIC CIRCUITRY AND CONFIGURATION DATA STORAGE ON DIFFERENT DICE

FIELD OF THE INVENTION

The present invention relates to manufacturing of programmable logic devices.

BACKGROUND OF THE INVENTION

Programmable logic devices (PLDs), such as field-programmable gate arrays (FPGAs), are user-programmable integrated circuits that can be programmed to implement user-defined logic circuits. A typical FPGA architecture (for example, a Virtex FPGA available from Xilinx Inc. of San Jose Calif.), includes an array of configurable logic blocks (CLBs), a programmable interconnect structure, and programmable input/output blocks (IOBs). Each of the CLBs, the programmable interconnect structure, and the IOBs includes configuration memory cells, the contents of which determine how the CLB, the programmable interconnect structure, or the IOB is configured. To realize a user-defined circuit, configuration data is loaded into the configuration memory cells such that the CLBs and IOBs and programmable interconnect are configured to realize particular circuit components used in the user-defined circuit.

The configuration memory cells on the FPGA may, for example, be loaded from a frame shift register. In such a case, a stream of configuration data bits is typically serially loaded into the frame shift register, and then each configuration memory cell is loaded with an appropriate configuration data bit from the frame shift register. The part of the FPGA circuitry that is configurable to realize the user-defined circuit is referred to here as the "configurable logic portion". The part of the FPGA circuitry (for example, the configuration memory cells) that stores and supplies the configuration data bits to the configurable logic portion is referred to here as the "configuration memory". Often an external memory device such as a programmable read only memory (PROM) is disposed on a printed circuit board along with the FPGA such that on power up of the FPGA, configuration data stored in the PROM is serial loaded into the configuration memory of the FPGA such that the FPGA is configured to realize the user-defined circuit.

FIG. 1 (Prior Art) is a simplified conceptual diagram of an SRAM-based FPGA 1. Square 2 represents a configuration memory cell of the configuration memory 3 of FPGA 1. Configuration memory cell 2 stores a configuration data bit that configures a pass transistor 4 of a programmable interconnect structure of the configurable logic portion 5 of FPGA 1. Both the configuration memory 3 and the configurable logic portion 5 of FPGA 1 are disposed on a single integrated circuit die. Typically the configuration memory of an FPGA occupies about one third of the total die area of the FPGA.

A user-defined design may involve more circuit functionality than can be realized on a single FPGA integrated circuit. It would be desired to increase the size of the FPGA integrated circuit to be able to provide circuitry to realize this functionality, but the maximum size of the FPGA integrated circuit is limited by current semiconductor processing technology. An integrated circuit whose size is limited in this way is sometimes referred to as "reticle-limited". It is therefore desired to be able to increase the amount of integrated circuit area available for the FPGA beyond the maximum amount available in a reticle limited FPGA integrated circuit. Also, it may be difficult to produce a large complex integrated circuit without defects. The yield of such large devices may be low, causing these devices to be very expensive to produce. A solution is desired.

SUMMARY

The circuitry of a programmable logic device (for example, an FPGA) includes a configurable logic portion and a configuration memory. The configuration memory supplies configuration data bits to the configurable logic portion. When the configuration data bits are supplied to the configurable logic portion, the configurable logic portion is configured to realize a user-defined circuit. In accordance with one embodiment, the configurable logic portion is disposed on a first die whereas the configuration memory is disposed on a second die. Each bit of configuration data passes through a pair of micropads. One micropad of the pair is disposed on the first die and the other micropad of the pair is disposed on the second die such that when the first die and second die are brought together in face-to-face relation, the two micropads touch and form an electrical connection through which the configuration data bit passes from the second die to the first die. Multiple different micropad structures for coupling the first die to the second die are described in the detailed description below. By not having to provide the configuration memory of the programmable logic device on the same die as the configurable logic portion, the amount of die area usable for the configurable logic portion is increased in situations where the maximum size of the first die is reticle limited. Further, by placing these two portions of the FPGA on two separate dice, the yield of each of these dice is improved.

If a flexible reprogrammable SRAM-based FPGA is desired, then the second die may be a die having a configuration memory made up of memory cells. The configuration memory may also include an infrastructure to load configuration data into the memory cells and to read the loaded configuration data back. Each of the memory cells stores one configuration data bit for the user-defined design. To switch to low-cost, high-volume production, the same type of first die can be used but with a different type of second die. The second die, rather than storing configuration data bits in memory cells, stores the same configuration data bits in the form of hardwired connections to either a power supply grid (a logic "1") or a ground potential grid (a logic "0").

In one embodiment, the second die is customized to store configuration data bits for a user-defined circuit by customizing just one metal mask used to make the second die. Because this second die is relatively simple and includes little or no active circuitry, production of the second die is relatively inexpensive. Production costs of the composite FPGA including the first die and the second die may therefore be reduced. Because the way the first die (the configurable logic portion) is configured is the same regardless of whether the hardwired second die is used or whether the second die having memory cells is used, migrating the user's design to the hardwired second die does not change the timing or performance of the user-defined circuit. Switching to high-volume, low-cost production is therefore facilitated.

In yet another embodiment, the second die is eliminated for high-volume low-cost production. Rather, one or more additional layers of metal are provided on the first die to connect each micropad on the first die to either a logic high voltage or a logic low voltage. A power supply grid and a ground potential grid may, for example, also be fashioned from these additional layers of metal on the first die. Each micropad on the first die is coupled to one or the other of these grids. In such an embodiment, the micropads may simply constitute vias.

As set forth above, on average, the configuration memory of an FPGA occupies about one third of total die area when the configuration memory and the configurable logic portion are both realized on the same integrated circuit. Due to placing both the configuration memory and the configurable logic portion on the same die, the amount of remaining die area usable for the configurable logic portion may be reticle-limited. In accordance with one embodiment, the amount of programmable logic functionality of a reticle-limited FPGA is increased by placing the associated configuration memory onto the second die.

Where the area of the second die and the first die are the same, not all of the second die area is typically required to implement the configuration memory. Accordingly, the excess area on the second die is usable for other purposes. For example, specialized circuitry may be placed on the second die. Multiple different versions of the second die can be made available for use with a first die of a particular design. In order to match a corresponding pattern of micropads on the first die, the pattern of the micropads on these different versions of the second die may be the same. Some of the versions of the second die may include one form of specialized circuitry, others may include another form of specialized circuitry, whereas other versions of the second die may not include the specialized circuitry.

In accordance with some embodiments, the configuration memory is realized using design rules and/or technologies permitting higher voltage operation. Where the second die has circuitry operating at higher supply voltages, the pass transistors in the first die in one embodiment operate more efficiently due to the higher voltage supplied from the memory cells on the second die to transistor gates in the first die.

Other structures and methods are described in the detailed description below. This summary does not purport to define the invention. The invention is defined by the claims.

BRIEF DESCRIPTION OF THE FIGURES

FIG. 1 (prior art) is a conceptual view the configuration memory and the configurable logic portion of a conventional FPGA.

FIG. 2 is a conceptual perspective view of a programmable logic device (PLD) in accordance with an embodiment of the present invention wherein the PLD includes a first die upon which the configurable logic portion of the PLD is disposed and a second die upon which the configuration memory of the PLD is disposed. The two dice are stacked and bonded together in stacked relation to form the composite PLD.

FIG. 3 is a simplified cross-sectional diagram of a first example of a protruding micropad structure and a recessed micropad structure usable to communicate configuration data bits between the two dice of FIG. 2.

FIG. 4 is a perspective view of the recessed micropad structure of FIG. 3.

FIG. 5 is a perspective view of the protruding micropad structure of FIG. 3.

DETAILED DESCRIPTION

Figure 6:
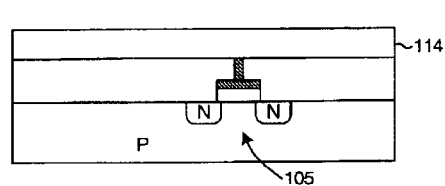
FIGS. 6–12 are cross-sectional diagrams that illustrate one way that the protruding micropad structure of FIG. 3 can be made.
Figure 7:
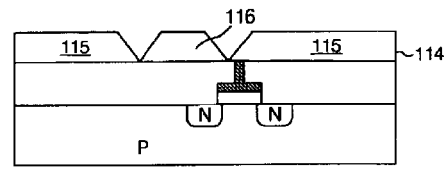

FIG. 2 is a simplified diagram of a programmable logic device in accordance with an embodiment of the present invention. In this example, the programmable logic device is a field programmable gate array (FPGA) 100. The circuitry of FPGA 100 is split such that all or substantially all of the configurable logic portion 101 of FPGA 100 is disposed on a first die 102, whereas all or substantially all of the configuration memory 103 of FPGA 100 is disposed on a second die 104. Second die 104 is coupled to first die 102 such that configuration data stored in configuration memory 103 is communicated to and configures the configurable logic portion 101. The configurable logic portion 101 so configured realizes a user-defined circuit.

In the example of FIG. 2, second die 104 is stacked on top of first die 102 in face-to-face relation such that the face side of first die 102 faces the face side of second die 104. The term face side used here denotes the side of the die that receives the bulk of semiconductor processing such that circuitry is fabricated on that face side of the die. The squares illustrated on second die 104 represent configuration memory cells of the configuration memory 103. Each configuration memory cell stores a configuration data bit that configures an associated part of the underlying configurable logic portion 101. One example of a part of the configurable logic portion 101 to be configured is a pass transistor 105 of the programmable interconnect structure of FPGA 100. Pass transistor 105 is configured by a configuration data bit stored in an associated memory cell 106 of the overlying configuration memory 103. Dashed line 107 represents the passing of the configuration data bit from memory cell 106 to pass transistor 105. A conductive micropad 108 is disposed on the face of second die 104, and an associated conductive micropad 109 is disposed on the face of first die 102. When second die 104 is stacked on first die 102, the conductive micropads 108 and 109 contact each other, thereby forming an electrical connection through which the configuration data bit passes from memory cell 106 to pass transistor 105.

Although a pass transistor of the programmable interconnect structure is illustrated here as being configured by memory cell 106, it is to be understood that other parts of configurable logic portion 101, for example, configurable logic blocks (CLBs) and input/output blocks (IOBs), are similarly configured using the micropad mechanism.

FIG. 3 is a simplified cross-sectional diagram of one example of micropads 108 and 109 of FIG. 2. Micropad 108 is a recessed structure in the face of second die 104. FIG. 4 is a perspective view of micropad 108. Micropad 109 is a truncated pyramid-shaped protrusion that extends from the face of first die 102. FIG. 5 is a perspective view of micropad 109. In this embodiment, micropads 108 and 109 are substantially smaller than the bonding pads of IOBs of the configuration logic portion 101. In contrast to bonding pads that are disposed only around the periphery of a die, the smaller micropads can be disposed across the entire surface of the first die 102 including in the center of first die 102.

Memory cell 106 of FIG. 2 may, for example, include a pair of cross-coupled inverters. N-channel transistor 110 and P-channel transistor 111 of FIG. 3 represent a pair of transistors that together form one of these cross-coupled inverters. The output of the inverter formed by transistors 110 and 111 is coupled by interconnect on die 104 to a metal pad 112. To make the structure of micropad 108, a metal layer is deposited, patterned, and etched to form pad 112. An insulating layer 113 of passivation is then formed over pad 112, and a hole is cut into the passivation layer to expose a top surface of pad 112. The resulting recessed micropad structure 108 is illustrated in perspective view in FIG. 4.

Pass transistor 105 of the programmable interconnect structure on die 102 is illustrated in cross-section in FIG. 3. The gate of this pass transistor is coupled by interconnect on die 102 to a metal-covered truncated pyramid-shaped protrusion. This protrusion is micropad 109. Micropad 109 is illustrated in perspective view in FIG. 5.

When dice 102 and 104 are brought together in face-to-face relation, protruding micropad 109 fits into the recess provided by recessed micropad structure 108 such that electrical communication is established between memory cell 106 and pass transistor 105. Then during operation of the composite FPGA, a configuration data bit stored in memory cell 106 is thereby communicated to first die 102 to configure pass transistor 105.

Figure 8:
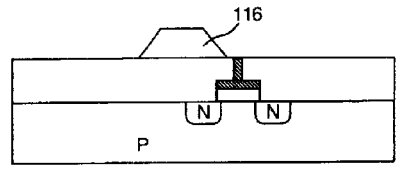
Figure 9:
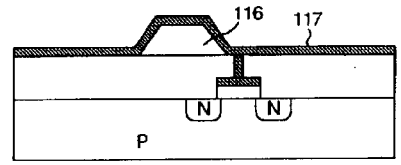
Figure 10:
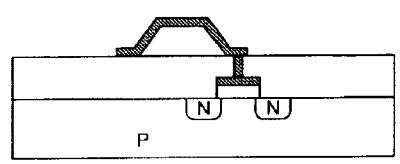
Figure 11:
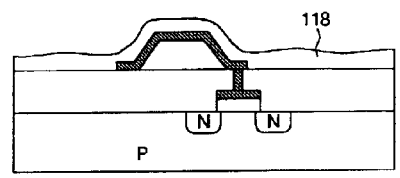
Figure 12:
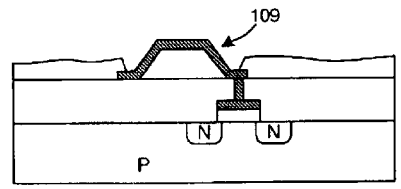

FIGS. 6–12 illustrate one way that truncated pyramid-shaped protruding micropad 109 can be formed. First, as illustrated in FIG. 6, a layer 114 of insulating material is deposited over pass transistor 105. Using lithographic and etching techniques, a V-shaped groove is cut into layer 114. The resulting structure is illustrated in cross-section in FIG. 7. Using lithographic and etching techniques, the outer portion 115 of layer 114 is removed, thereby leaving a truncated-pyramid structure 116 of insulative material. This resulting structure is illustrated in FIG. 8. Next, a layer 117 of metal is deposited over the truncated-pyramid structure 116 as shown in FIG. 9. Metal layer 117 is then patterned and etched to leave the structure illustrated in FIG. 10. Next, a layer 118 of passivation is deposited over the entire structure as illustrated in FIG. 11. The passivation layer 118 is patterned and etched to expose the metal-covered truncated-pyramid shaped protruding micropad 109 shown in FIG. 12.

For simplicity, only one pair of mating micropad structures is illustrated in FIG. 2. There are, however, in an actual embodiment a great many such pairs of micropad structures. In one embodiment, there is one such pair of mating micropad structures for each configuration memory bit of the configuration memory 103 of FPGA 100. Proper alignment of die 102 and die 104 is facilitated because each of the protruding micropad structures fits into a corresponding one of the recessed micropad structures. The recessed opening of the recessed micropad 108 may be made larger than the top surface of the protruding micropad 109 in order to facilitate establishing and maintaining electrical contact between the two dice. For more information and detail on suitable micropad structures for joining first die 102 to second die 104 in accordance with an embodiment of the present invention, and for additional information on how to fabricate protruding micropads and accommodating recessed micropads, see: 1) U.S. Pat. No. 6,271,059 issued to Bertin et al., 2) U.S. Pat. No. 6,114,221 issued to Tonti et al., 3) U.S. Pat. No. 6,410,431 issued to Bertin et al., 4) U.S. Pat. No. 6,444,560 issued to Pogge et al., 5) Published U.S. patent application No. US 2002/0064906 by Enquist, and 6) U.S. Pat. No. 6,368,930 issued to Enquist. The entirety of the subject matter of each of these patent documents is hereby incorporated by reference.

Figure 13:
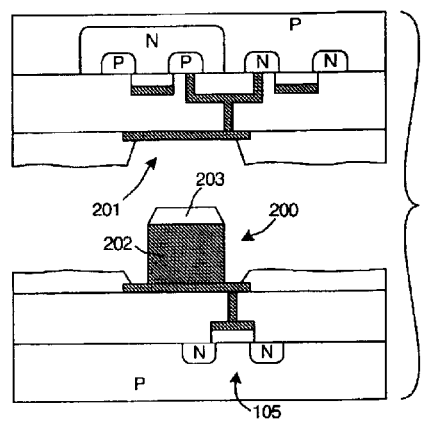
FIG. 13 is a simplified cross-sectional diagram of a second example of a protruding micropad structure and a recessed micropad structure usable to communicate configuration data bits between the two dice of FIG. 2.
Figure 14:
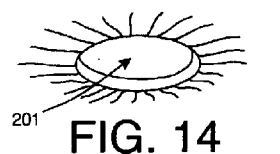
FIG. 14 is a perspective view of the recessed micropad structure of FIG. 13.
Figure 15:
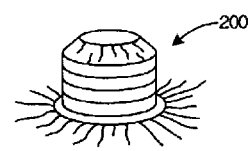
FIG. 15 is a perspective view of the protruding micropad structure of FIG. 13.

FIG. 13 is a simplified cross-sectional diagram of a second example of micropad structures usable to couple die 102 to die 104. The top of a cylindrically-shaped protruding micropad structure 200 makes electrical contact with an associated recessed micropad structure 201. Cylindrical portion 202 of micropad 200 may be made of copper. Portion 203 is an optional layer of solder. FIG. 14 is a simplified perspective view of recessed micropad structure 201. FIG. 15 is a simplified perspective view of protruding micropad structure 200.

Figure 16:
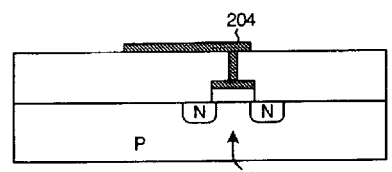
FIGS. 16–23 are cross-sectional diagrams that illustrate one way that the protruding micropad structure of FIG. 13 can be made.
Figure 17:
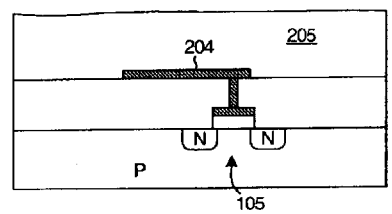
Figure 18:
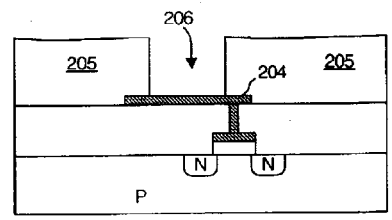
Figure 19:
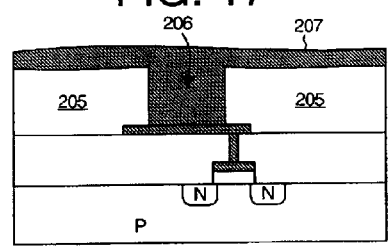
Figure 20:
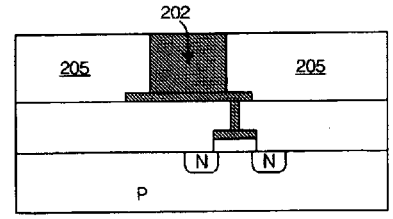
Figure 21:
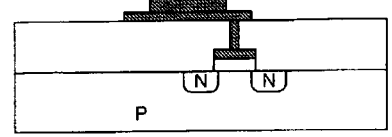
Figure 22:
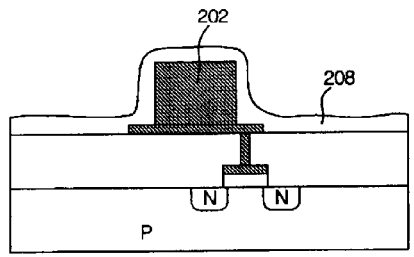
Figure 23:
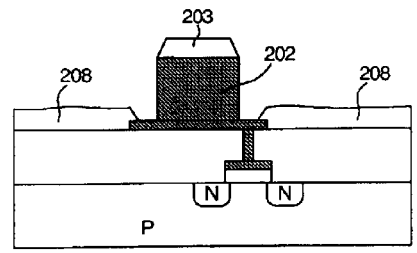

FIGS. 16–23 illustrate one way that protruding micropad 200 can be formed. First, as illustrated in FIG. 16, a layer of metal is deposited and this layer is patterned and etched to form a pad 204. Pad 204 is coupled to the gate of underlying pass transistor 105 as shown. Next, a layer 205 of an insulating material is deposited over pad 204 as shown in FIG. 17. A hole 206 is then etched into layer 205 to expose the top of pad 204 as illustrated in FIG. 18. A layer 207 of metal, for example copper, is then deposited to fill hole 206. The resulting structure is illustrated in FIG. 19. A planarizing chemical mechanical polishing (CMP) process is then performed to form a cylindrical portion 202 as illustrated in FIG. 20. The remaining portions of layer 205 are then removed in an etching step as shown in FIG. 21. A passivation layer 208 is then deposited over the structure as shown in FIG. 22, and this passivation layer is patterned and etched to expose the protruding micropad as illustrated in FIG. 23. The step of FIG. 19 may have included adding optional layer 203 of solder to the top of cylindrical portion 202. Solder layer 203 may be used to solder protruding micropad 200 to recessed micropad 201. For additional information on one suitable protruding micropad structure 200 and an accommodating recessed micropad structure 201, and for additional information on how to fabricate and apply solder to micropads 200 and 201, see: 1) U.S. Pat. No. 6,410,431 issued to Bertin et al., and 2) U.S. Pat. No. 6,444,560 issued to Pogge et al. The entire subject matter of both of these patents is hereby incorporated by reference.

Figure 24:
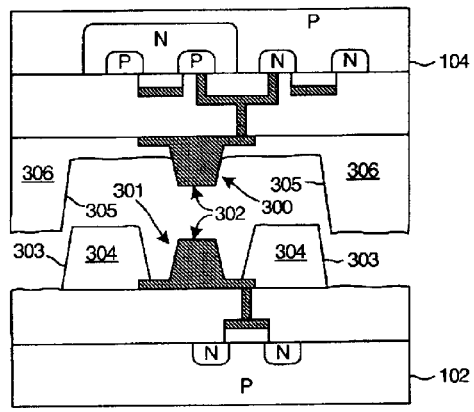
FIG. 24 is a simplified cross-sectional diagram of a third example of a protruding micropad structure and a recessed micropad structure usable to communicate configuration data bits between the two dice of FIG. 2.
Figure 25:
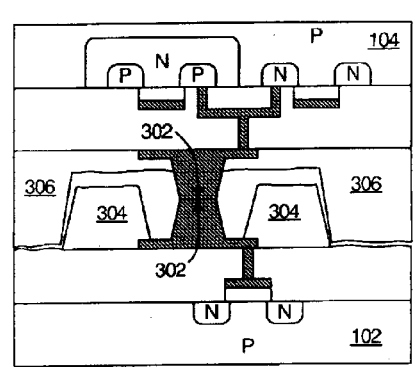
FIG. 25 is a cross-sectional diagram of the micropad structures of FIG. 24 when they are in contact with one another.

FIG. 24 is a cross-sectional diagram of a third example of micropad structures usable to couple die 102 to die 104. Both micropad 300 on die 104 as well as micropad 301 on die 102 have tip portions 302 that contact one another when die 102 and die 104 are coupled together. FIG. 25 is a cross-sectional diagram showing the tip portions 302 of the two micropads 300 and 301 in contact when the two micropads 300 and 301 are coupled. In one embodiment the tip portions 302 are of a small diameter or are otherwise fashioned to collapse or crush in a controlled fashion under pressure when die 104 is stacked on die 102. The result is a weak mechanical bond between the two micropads 300 and 301. Die 104 and die 102 are held in position by the great number of pairs of these mated micropad structures.

To facilitate the alignment of dice 102 and 104 with respect to one another such that the micropads 300 and 301 mate correctly, dice 102 and 104 include complementary alignment structures. In the example of FIG. 24, the outer cylindrical surface 303 of a washer-shaped ring 304 of a thick insulating layer disposed on die 102 slidingly engages a corresponding inner surface 305 of a thick insulating layer 306 on die 104. As dice 102 and 104 are brought together, edges 303 and 305 operate to align dice 102 and 104 properly before the tip portions 302 of micropads 300 and 301 contact one another. For additional information on fabricating suitable alignment features for aligning dice 102 and 104 in accordance with the present invention, see U.S. Pat. No. 5,532,519 issued to Bertin et al., the subject matter of which is incorporated herein by reference. For information on another metal pad structure suitable for coupling dice 102 and 104 together, see a description of Cu—Ta bilayer pads that are fused together by applying a compressive force at 400 degrees C. in the article by Banerjee et al., entitled "3D ICs: A Novel Chip Design for Improving Deep-Submicrometer Interconnect Performance and Systems-on-Chip Integration," Proceedings of the IEEE, vol. 89, No. 5, May 2001, by Banerjee et al. (the subject matter of this paper is hereby incorporated in its entirety).

Although the alignment features of FIGS. 24 and 25 are described as circular-shaped, alignment features in accordance with other embodiments of the present invention can have other shapes and sizes. In some embodiments, for example, alignment structures on a die are made significantly larger than the micropads on the die. The alignment structures are made larger so that they will have adequate strength to absorb mechanical forces due, for example, to imprecise alignment by a handler mechanism as well as differential thermal expansion of dice 102 and 104. The size of the micropads, on the other hand, is relatively small and may be on the order of the size of the associated memory cells that store the configuration bits.

Figure 26A:
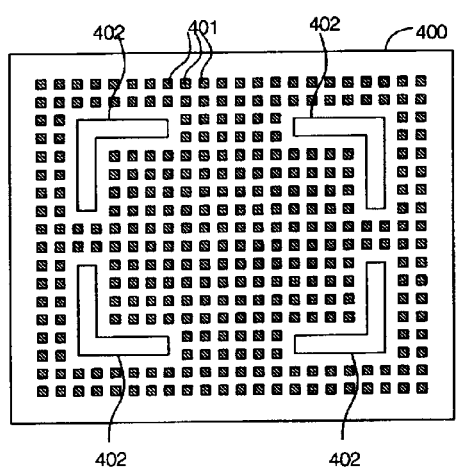
FIG. 26A is a view of an embodiment of a die having micropad structures and protruding alignment structures in accordance with an embodiment of the present invention.

FIG. 26A is a view of the face of a die 400 having a plurality of micropads 401 (the micropads are shown in the diagram as small squares) and four alignment structures 402 (shown in the diagram as L-shaped protruding structures of an insulating material). A second die that is to mate with die 400 has alignment structures of the same L-shape, but the alignment structures on the second die are recesses into which the L-shaped protrusions on die 400 will fit when properly aligned.

Figure 26B:
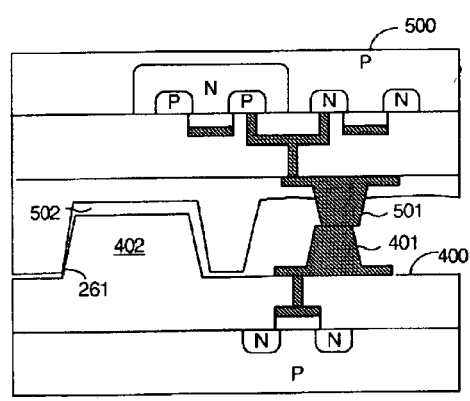
FIG. 26B is a side view of a portion of FIG. 26A, shown in contact with another structure having a recessed alignment structure.

FIG. 26B shows a side cross-sectional view of a small portion of die 400 of FIG. 26A mated with a corresponding die 500. A recess 502 in die 500 receives protruding alignment structure 402 of die 400. Protruding alignment structure 402 protrudes above micropads 401 so that when alignment structure 402 is not aligned with alignment recess 502, there is no contact between any of micropads 401 of die 400 and micropads 501 of die 500. When alignment is sufficiently close, protruding alignment structure 402 slides into recess 502 so that micropad 401 comes into contact with micropad 501. Recess 502 is sufficiently deep that a top surface of protruding alignment structure 402 does not rest on recess 502. However, sloping walls of protruding alignment structure 402 and recess 502 adjust the alignment as the two dice are being brought together. In the example of FIG. 26B, these sloping walls remain in contact at location 261, thus minimizing misalignment between micropads 401 and 501.

Figure 27:
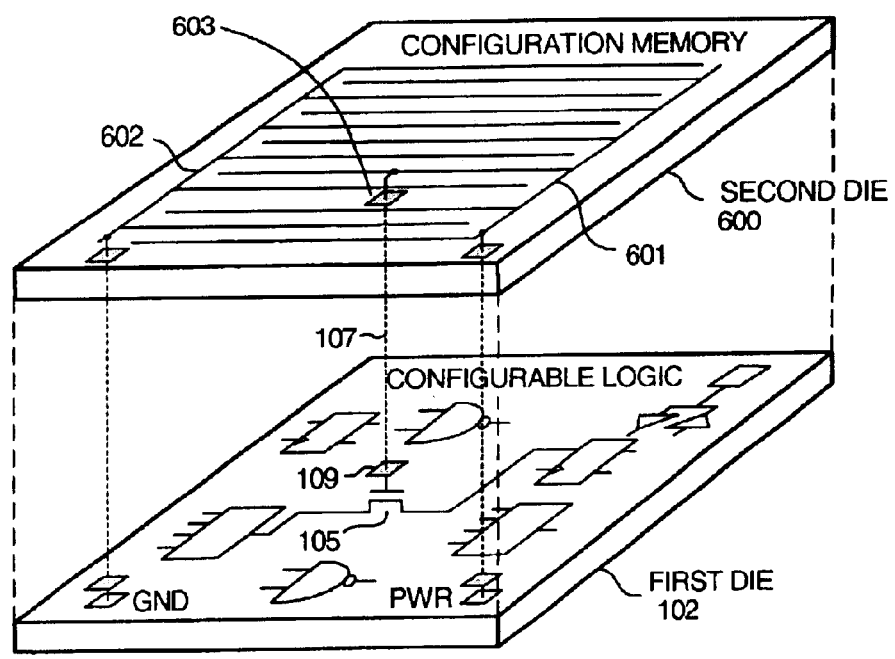
FIG. 27 is a simplified perspective diagram of a programmable logic device (PLD) in accordance with an embodiment of the present invention wherein the second die stores configuration data bits in the form of hardwired connections to voltage grids.

Although the configuration data bits are described in the example of FIG. 2 above as being stored in configuration memory cells, this need not be the case. FIG. 27 shows an embodiment of the present invention wherein the configuration memory on die 600 includes no or substantially no configuration memory cells. Rather, configuration data bits are stored in hardwired connections to either a first voltage distribution grid 601 or to a second voltage distribution grid 602. First voltage distribution grid 601 may, for example, carry a logic one voltage (for example, supply voltage VCC), whereas the second voltage distribution grid 602 may carry a logic zero voltage (for example, ground potential). If the configuration data bit to be supplied by micropad 603 is a logic one, then micropad 603 is hardwired to voltage distribution grid 601 that supplies the logic one voltage. If, on the other hand, the configuration data bit to be supplied by micropad 603 is to a logic zero, then micropad 603 is hardwired to voltage distribution grid 602 that supplies the logic zero voltage. Die 600 of FIG. 27 having hardwired configuration memory circuitry may be manufactured for a lower cost than die 102 of FIG. 2. Only one metal mask need be generated to customize die 600 to store user-specific configuration data bits for configuring the configurable logic portion of the FPGA. The same type of underlying configurable logic portion die 102 can be used, both with a configuration memory having memory cells such as illustrated in FIG. 2, and with a configuration memory having hardwired configuration data as illustrated in FIG. 27.

In one method, an FPGA user purchases FPGAs wherein the configuration data bits are stored in memory cells on die 102 as shown in FIG. 2. Such FPGAs may be used for prototyping and for relatively low volume production. To reduce costs in high volume production, the user switches to using a hardwired configuration memory die such as die 600 of FIG. 27. This switch can be made without altering the way the underlying configurable logic portion is manufactured. Accordingly, the timing and performance of the user-defined circuit as realized on the underlying die 102 does not change. The user-defined circuit therefore need not be reanalyzed when the design migrates from the SRAM-based FPGA structure of FIG. 2 to the lower cost hardwired structure of FIG. 27.

Rather than providing a second die with the configuration data bits stored in hardwired connections as set forth above, a second low-cost hardwired solution in accordance with an embodiment of the present invention involves forming an additional layer or layers of metal on the top of the first die such that each of the various micropads on the first die is coupled to the appropriate one of a logic high voltage or a logic low voltage. The logic high voltage can be received from a single power supply grid fashioned in the additional layer of metal and the logic low voltage can be received from a ground potential grid fashioned in the additional layer of metal. In this way, a user-defined circuit can be migrated from the SRAM-based FPGA structure of FIG. 2 to the lower cost hardwired structure where configuration data bits are stored in the form of metallization on top of the first die itself.

Although the present invention is described in connection with certain specific embodiments for instructional purposes, the present invention is not limited thereto. Although several examples of micropad structures are set forth above for illustrative purposes, numerous other suitable micropad structures may be employed to couple two dice together in accordance with aspects of the present invention. Although a memory cell configuration memory and a hardwired configuration memory are described above in connection with FIGS. 2 and 27, these are but examples of types of configuration memory circuitry. Configuration memory circuitry can, for example, involve any suitable hardwired wiring structure, non-volatile memory structure, antifuse structure, fuse structure, volatile memory structure, flash memory structure, read only memory structure, mask programmable read-only memory structure, or other suitable memory structure.

Although the present invention is described in connection with the configurable logic portion including a programmable interconnect structure, CLBs, and IOBs, it is to be understood that other types of configurable logic portions may be used. FPGA 100 may, for example, include numerous other configurable circuits that are usable in a user-defined design. Die 102 may, for example, also include other circuitry needed to make the composite FPGA operate but does not perform logic functions in the user-defined circuit. Although the present invention is described in connection with stacked dice 102 and 104 being an FPGA, it is to be understood that the two dice may, in some embodiments, together comprise another type of programmable logic device. Stacked die FPGA structures need not be stacked in face-to-face relation, but rather the face of one die may be stacked to be in contact with the backside surface of another die. Stacked die FPGA structures in accordance with aspects of the present invention may involve more than two stacked dice. Accordingly, various modifications, adaptations, and combinations of various features of the described embodiments can be practiced without departing from the scope of the invention as set forth in the following claims.

What is claimed is:

1. A device, comprising:
   a configurable logic portion disposed on a first structure; and a configuration memory disposed on a second structure, the first structure physically separable from the second structure, the first structure and the second structure being disposed in a stacked relation to one another, wherein the first structure is coupled to the second structure such that configuration data is communicated from the configuration memory to the configurable logic portion and configures the configurable logic portion, wherein one of the first and second structures comprises a protruding alignment structure, and the other of the first and second structures comprises a recessed alignment structure, the protruding alignment structure engaging the recessed alignment structure when the first structure and the second structure are in said stacked relation.

2. The device of claim 1, wherein the device is a field programmable gate array, and wherein the configurable logic portion comprises configurable logic blocks, input/output blocks, and a programmable interconnect structure.

3. The device of claim 1, wherein the configurable logic portion comprises a plurality of pass transistors, and wherein the configuration memory comprises a plurality of memory cells, each of the memory cells storing a configuration data bit that controls a corresponding one of the plurality of pass transistors.

4. The device of claim 1, wherein the first structure comprises a first micropad, and wherein the second structure comprises a second micropad, the first structure being coupled to the second structure such that the first micropad is in electrical communication with the second micropad.

5. The device of claim 1, wherein the configurable logic portion is disposed on a face of the first structure, and wherein the configuration memory is disposed on a face of the second structure, and wherein the first structure is bonded to the second structure in a face-to-face relation.

6. The device of claim 1, wherein the first structure and the second structure each have a face and a backside, wherein the configurable logic portion is disposed on the face of the first structure, wherein the configuration memory is disposed on the face of the second structure, and wherein the face of the first structure is bonded to the backside of the second structure.

7. The device of claim 1, wherein the first structure and the second structure each have a face and a backside, wherein the configurable logic portion is disposed on the face of the first structure, wherein the configuration memory is disposed on the face of the second structure, and wherein the face of the second structure is bonded to the backside of the first structure.

8. The device of claim 1, wherein the first structure has a face and a backside surface, and wherein the second structure has a face and a backside surface, the configurable logic portion being disposed on the face of the first structure, and wherein the configuration memory is disposed on the face of the second structure, and wherein the first structure is coupled to the second structure in a face-to-face relation.

9. The device of claim 1, wherein the configuration memory comprises a plurality of configuration memory cells.

10. The device of claim 1, wherein the configuration memory comprises first voltage distribution grid, a second voltage distribution grid, and a plurality of micropads, each of the micropads being connected to a selected one of the first and second voltage distribution grids.

11. The device of claim 1, wherein the configuration memory contains no memory cells that store configuration data bits.

12. The device of claim 1, wherein the configuration memory provides configuration data bits by providing connections from the configurable logic portion to logic one and logic zero voltage sources.

13. A method of forming a device, comprising:
    stacking a first structure and a second structure together, the first structure physically separable from the second structure, and electrically connecting the first structure to the second structure such that a configuration data bit maintained on the second structure is communicated to the first structure, the configuration data bit configuring configurable logic on the first structure, wherein one of the first and second structures includes a protruding alignment feature, and the other of the first and second structures includes a recessed alignment feature, the protruding alignment feature engaging the recessed alignment feature when the first structure and the second structure are stacked together.

14. The method of claim 13, wherein the first structure and the second structure together comprise a field programmable gate array, the configurable logic comprising a pass transistor of a programmable interconnect structure of the field programmable gate array.

15. The method of claim 13, wherein the first structure comprises a first micropad, and wherein the second structure comprises a second micropad, and wherein the configuration data bit is communicated from the second structure to the first structure through an electrical connection established between the second micropad and the first micropad.

16. The method of claim 13, wherein the first structure and the second structure together comprise a programmable logic device, the programmable logic device comprising a configuration memory and a configurable logic portion, wherein substantially all of the configuration memory is disposed on the second structure, and wherein substantially all of the configurable logic portion is disposed on the first structure.

17. An integrated circuit, comprising:
a programmable logic portion including a plurality of configurable elements; and
a plurality of micropads disposed across a surface of the integrated circuit, each of the micropads being coupled to a corresponding one of the plurality of configurable elements, wherein at least some of the plurality of micropads are one of protruding micropads and recessed micropads.

18. The integrated circuit of claim 17, wherein each of the micropads is usable to receive a bit of configuration data onto the integrated circuit.

19. A method of forming an integrated circuit device comprising:
providing a first device having configurable circuitry for implementing a logic function and a plurality of first micropads disposed in a pattern on a surface of the first device;
providing a second device having circuitry for providing configuration signals and a plurality of second micropads disposed in the pattern, the second device being adapted to be coupled to the surface of the first device in a stacked relation such that each of the first micropads on the first device couples with a corresponding one of the second micropads on the second device wherein at least some of the plurality of micropads are one of protruding micoropads and recessed micropads.

20. The method of claim 19, further comprising:
providing a third device that includes a plurality of third micropads disposed in the pattern, the third device being adapted to be coupled to the surface of the first device in a stacked relation such that each of the plurality of first micropads on the first device couples with a corresponding one of the third micropads on the third device, wherein the second device and the third device have different circuitry.

21. The method of claim 19, wherein each of the second micropads on the second device is hardwired to receive one of a first logic value and a second logic value.

22. The method of claim 19, wherein the second device is a mask-programmable device, wherein at least some of the second micropads are programmably couplable to one of a first voltage distribution grid on the second device and a second voltage distribution grid on the second device.

23. A method, comprising:
coupling a first device having configurable logic to a second device having structure for providing configuration data bits in a stacked relation such that the configuration data bits stored on the second device are communicated from the second device to the configurable logic on the first device such that the configurable logic on the first device is configured to realize a user-defined circuit; and
providing a third device having the configurable logic of the first device and further structure supplying each of the data bits of the second device such that the third device implements the same user-defined circuit as does the first device.

24. The method of claim 23, further comprising:
using the first device and the second device that are in a stacked relation to test the user-defined circuit prior to said providing the third device.

25. The method of claim 23, the further structure of the third device comprises a power supply grid and a ground potential grid, each of the plurality of micropads of the third device being coupled to one of the power supply grid and the ground potential grid.

26. The method of claim 23, wherein the first device and the second device that are in a stacked relation together comprise a field programmable gate array.

27. The method of claim 23, wherein the third device comprises a factory programmed gate array.

28. The method of claim 23 wherein
the step of providing a third device having the configurable logic of the first device and further structure comprises
forming a logic portion having a structure substantially identical to a structure of the first device except for a top mask layer; and
adding to the logic portion a substitute top mask layer having micropads corresponding to micropads of the first device and a grid of metal lines for supply high and low voltages to the logic portion.

29. The method of claim 23 wherein:
the step of providing a third device having the configurable logic of the first device and further structure comprises
forming a logic portion having a structure substantially identical to a structure of the first device; and
adding to the logic portion a top mask layer having a grid of metal lines for supply high and low voltages to the logic portion.

30. A device comprising:
a configurable logic portion disposed on a first die; and
a configuration memory disposed on a second die, the first die and the second die being disposed in a stacked relation to one another, wherein the first die is coupled to the second die such that configuration data is communicated from the configuration memory to the configurable logic portion and configures the configurable logic portion;
wherein one of the first and second dice includes a protruding alignment feature, and wherein the other of the first and second dice includes a recessed alignment feature, the protruding alignment feature engaging the recessed alignment feature when the first die and the second die are stacked together.

31. The device of claim 30, wherein the device is a field programmable gate array, and wherein the configurable logic portion comprises configurable logic blocks, input/output blocks, and a programmable interconnect structure.

32. The device of claim 30, wherein the configurable logic portion comprises a plurality of pass transistors, and wherein the configuration memory comprises a plurality of memory cells, each of the memory cells storing a configuration data bit that controls a corresponding one of the plurality of pass transistors.

33. The device of claim 30, wherein the first die comprises a first micropad, and wherein the second die comprises a second micropad, the first die being coupled to the second die such that the first micropad is in electrical communication with the second micropad.

34. The device of claim 30, wherein the configuration memory comprises first voltage distribution grid, a second voltage distribution grid, and a plurality of micropads, each of the micropads being connected to a selected one of the first and second voltage distribution grids.

35. The device of claim 30, wherein the configuration memory provides configuration data bits by providing connections from the configurable logic portion to logic one and logic zero voltage sources.

36. A method of forming a device, comprising:

stacking a first die and a second die together and electrically connecting the first die to the second die such that a configuration data bit maintained on the second die is communicated to the first die, the configuration data bit configuring configurable logic on the first die;

wherein one of the first and second dice includes a protruding alignment feature, and wherein the other of the first and second dice includes a recessed alignment feature, the protruding alignment feature engaging the recessed alignment feature when the first die and second die are stacked together.

37. The method of claim 36, wherein the first die and the second die together comprise a field programmable gate array, the configurable logic comprising a pass transistor of a programmable interconnect structure of the field programmable gate array.

38. The method of claim 36, wherein the first die comprises a first micropad, and wherein the second die comprises a second micropad, and wherein the configuration data bit is communicated from the second die to the first die through an electrical connection established between the second micropad and the first micropad.

39. The method of claim 36, wherein the first die and the second die together comprise a programmable logic device, the programmable logic device comprising a configuration memory and a configurable logic portion, wherein substantially all of the configuration memory is disposed on the second die, and wherein substantially all of the configurable logic portion is disposed on the first die.

* * * * *